(12) United States Patent
Hsu

(10) Patent No.: US 8,384,459 B2
(45) Date of Patent: Feb. 26, 2013

(54) DELAY LINE CIRCUIT AND PHASE INTERPOLATION MODULE THEREOF

(75) Inventor: Jen-Shou Hsu, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 38 days.

(21) Appl. No.: 13/104,034

(22) Filed: May 10, 2011

(65) Prior Publication Data

US 2012/0286838 A1 Nov. 15, 2012

(51) Int. Cl.
*H03H 11/16* (2006.01)
(52) U.S. Cl. ........................................ 327/231; 327/237
(58) Field of Classification Search .................... None
See application file for complete search history.

(56) References Cited

U.S. PATENT DOCUMENTS

| | | | |
|---|---|---|---|
| 5,945,862 A * | 8/1999 | Donnelly et al. | 327/278 |
| 6,650,159 B2 * | 11/2003 | Wang et al. | 327/258 |
| 6,650,160 B2 * | 11/2003 | Tanahashi | 327/277 |
| 7,173,466 B2 * | 2/2007 | Chiba et al. | 327/231 |
| 7,412,477 B1 | 8/2008 | Jennings | |
| 7,425,858 B1 * | 9/2008 | Daga | 327/279 |
| 7,482,884 B2 * | 1/2009 | Wang et al. | 331/45 |
| 2002/0125933 A1 * | 9/2002 | Tamura et al. | 327/390 |
| 2003/0006817 A1 * | 1/2003 | Seo et al. | 327/276 |
| 2005/0024117 A1 * | 2/2005 | Kubo et al. | 327/258 |
| 2006/0170459 A1 * | 8/2006 | Shin et al. | 326/113 |
| 2007/0153951 A1 * | 7/2007 | Lim et al. | 375/376 |

OTHER PUBLICATIONS

Garlepp et al.,"A Portable Digital DLL for High-Speed CMOS Interface Circuits," IEEE Journal of Solid-State Circuits, vol. 34, No. 5, May 1999, pp. 632-644.

* cited by examiner

*Primary Examiner* — Cassandra Cox
(74) *Attorney, Agent, or Firm* — Jianq Chyun IP Office

(57) ABSTRACT

A phase interpolation module comprising a first, second, and third phase interpolation units is proposed. Each of the first, second, and third phase interpolation units comprises a first through third inverters, a first and second resistors, wherein the first resistor is coupled between an output end of the first inverter and an input end of the third inverter, and the second resistor is coupled between an output end of the second inverter and the input end of the third inverter. The first and second inverters of the first phase interpolation unit receive a first signal, the first and second inverters of the third phase interpolation unit receive a second signal, and the first and second inverters of the second phase interpolation unit respectively receive the first and second signals.

15 Claims, 6 Drawing Sheets

DELAY LINE CIRCUIT AND PHASE INTERPOLATION MODULE THEREOF

FIELD OF THE INVENTION

The invention generally relates to the delay line circuit, more particular, to the delay line circuit implemented by phase interpolation, and also to the phase interpolation module thereof.

DESCRIPTION OF RELATED ART

In semiconductor devices, delay line circuits are used to adjust timing delays for input/output (I/O) signals, clock signals, etc. The delay line circuit having phase interpolator is one of those delay line circuits and is commonly used to adjust the timing of internal clock signals.

The analog phase interpolators use analog elements (adder, multiplier or mixer, amplifier, etc.) to adjust the phase difference between two reference clocks. Since time delays exist in those analog elements, delay compensation elements are necessary to adjust phase among reference clocks and interpolated clock. Moreover, there are different kinds of time jitter and variation in delay compensation elements. The time delays of such elements are also sensitive to change in incoming data rate, process parameters and temperature.

The digital elements (inverter, etc.) in the digital phase interpolator is used to adjust the phase difference between two reference clocks. The digital phase interpolator may be implemented in a simple circuit, and can precisely provide the signal with a defined phase. Therefore, the digital phase interpolator is commonly utilized in various semiconductor devices and circuits, such as the all-digital DLL. The well-designed digital phase interpolators or mixed-signal phase interpolators are necessary for the high-speed circuit or the circuit for generating clock signals.

Referring to FIG. 1, FIG. 1 shows a block diagram of a conventional delay line circuit. The delay circuit 400 includes a plurality of phase interpolation units 401~403. The phase interpolation unit 401 comprises three inverters 4011~4013. Input ends of the inverters 4011, 4012 receive a first input signal SI1, output ends of the inverters 4011, 4012 are coupled to an input end of the inverter 4013, and an output end of the inverter 4013 outputs a first output signal SO1 which is a delay version of the first input signal SI1. The phase interpolation unit 403 comprises three inverters 4031~4033. Input ends of the inverters 4031, 4032 receive a second input signal SI2, output ends of the inverters 4031, 4032 are coupled to an input end of the inverter 4033, and an output end of the inverter 4033 outputs a second output signal SO2 which is a delay version of the second input signal SI2.

The phase interpolation unit 402 comprises three inverters 4021~4023. Input ends of the inverters 4021, 4022 respectively receive the first input signal SI1 and the second input signal SI2, output ends of the inverters 4021, 4022 are coupled to an input end of the inverter 4023, and an output end of the inverter 4023 outputs a third output signal SO3 which is asserted between when the first and second output signals SO1, SO2 are asserted. The sizes of the inverters 4011 and 4012 are not identical to each other, the sizes of the inverters 4021 and 4022 are not identical to each other, and the sizes of the inverters 4031 and 4032 are not identical to each other either, such that the third output signal SO3 can be asserted at the middle time of the times when the first and second output signals SO1, SO2 are asserted. Furthermore, when the phases of the first and second input signals SI1, SI2 are not identical to each other, fighting currents are generated between the inverters 4021 and 4022.

SUMMARY OF THE INVENTION

According to an embodiment of the present invention, a phase interpolation module comprising a first, second, and third phase interpolation units is provided. Each of the first, second, and third phase interpolation units comprises a first through third inverters, a first and second resistors, wherein the first resistor is coupled between an output end of the first inverter and an input end of the third inverter, and the second resistor is coupled between an output end of the second inverter and the input end of the third inverter. The first and second inverters of the first phase interpolation unit receive a first signal, the first and second inverters of the third phase interpolation unit receive a second signal, and the first and second inverters of the second phase interpolation unit respectively receive the first and second signals.

According to an embodiment of the present invention, a delay line circuit is provided. The delay line circuit comprises a first phase interpolation module. The first phase interpolation module comprises a first, second, and third phase interpolation units. Each of the first, second, and third phase interpolation units comprises a first through third inverters, a first and second resistors, wherein the first resistor is coupled between an output end of the first inverter and an input end of the third inverter, and the second resistor is coupled between an output end of the second inverter and the input end of the third inverter. The first and second inverters of the first phase interpolation unit receive a first signal, the first and second inverters of the third phase interpolation unit receive a second signal, and the first and second inverters of the second phase interpolation unit respectively receive the first and second signals.

To sum up, the embodiment of the present invention provides a phase interpolation module having the inverters with the identical sizes, and therefore the phase interpolation module is relatively insensitive to the process variation. The phase interpolation modules may form a delay line circuit having the advantages of the phase interpolation unit as stated above. Moreover, a circuit layout of the delay line circuit is provided to reduce the critical timing issue of the signals.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
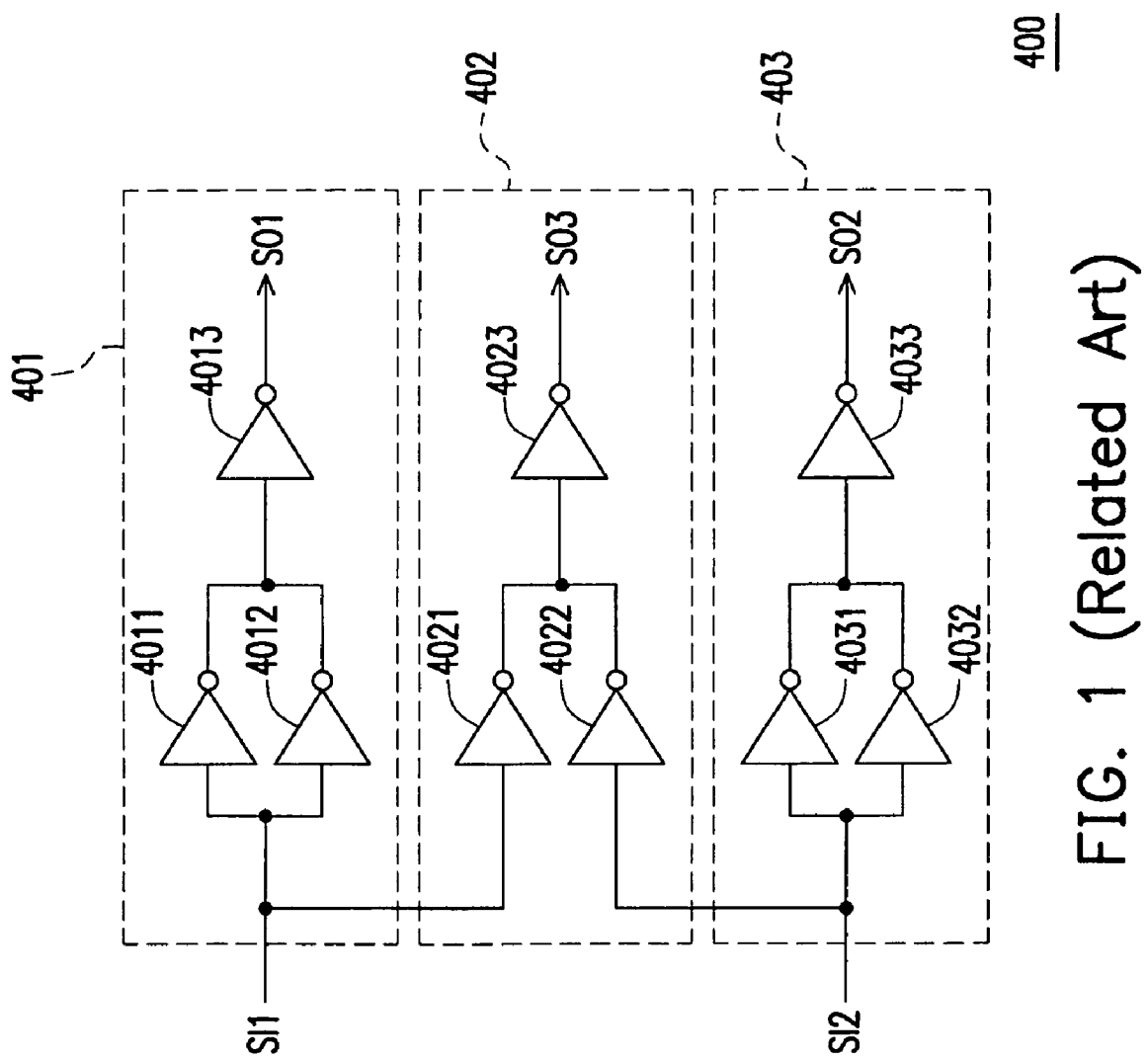
FIG. 1 shows a block diagram of a conventional delay line circuit.
Figure 2:
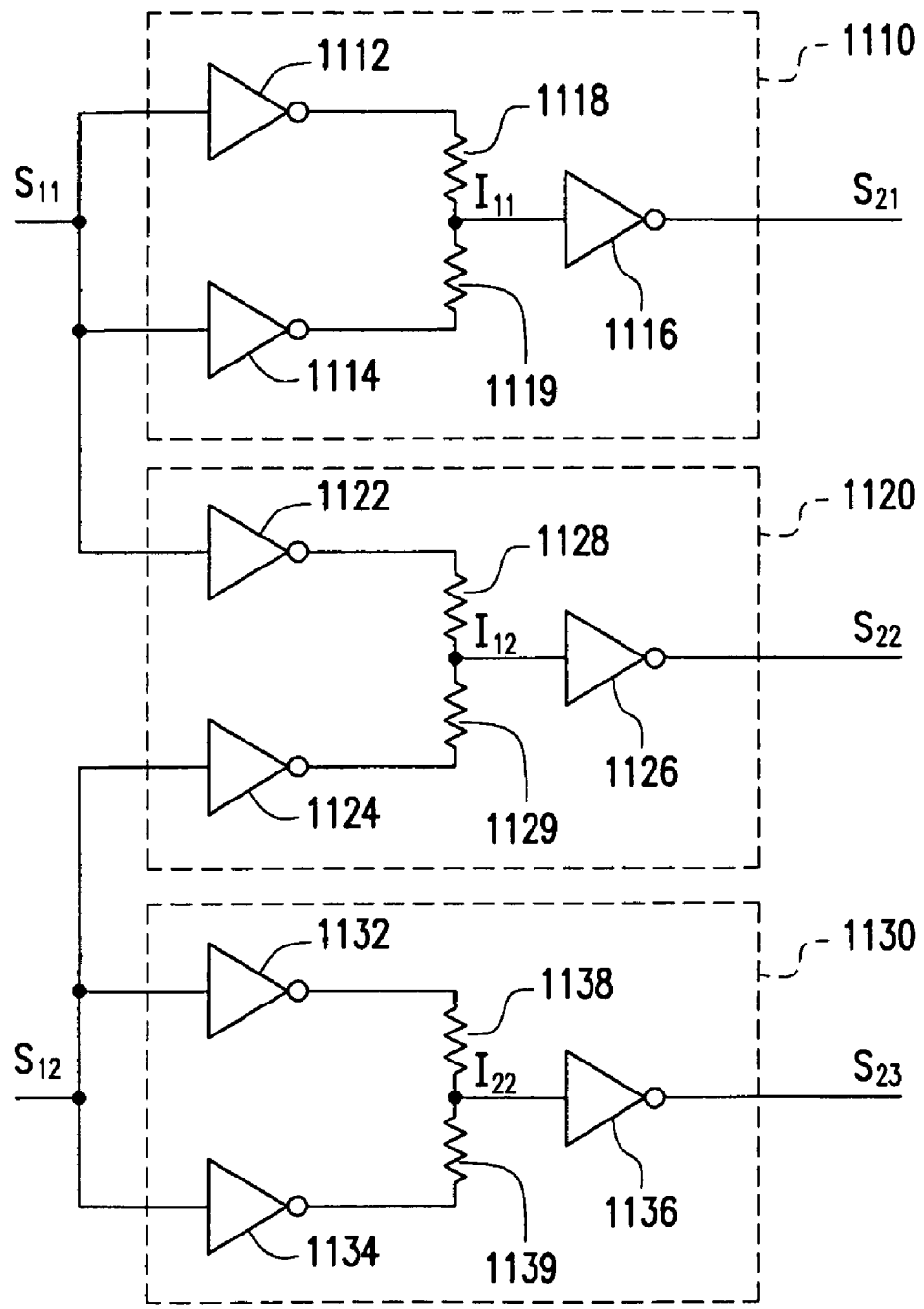
FIG. 2 shows the block diagram of a phase interpolation module 1100 according to an embodiment of the invention.

The phase interpolation unit used to implement the delay line circuit is illustrated as follows. The delay line circuit comprises at least one phase interpolation unit, and the phase interpolation units form at least one phase interpolation module. Referring to FIG. 2, FIG. 2 shows the block diagram of a phase interpolation module 1100 according to an embodiment of the invention.

The phase interpolation module 1100 comprises three identical phase interpolation units 1110-1130. The phase interpolation unit 1110 comprises three inverters 1112, 1114, 1116, and two resistors 1118, 1119, wherein the output ends of the inverters 1112 and 1114 are respectively coupled to ends of the resistors 1118 and 1119, the input end of the inverter 1116 is coupled to the other ends of the resistors 1118 and 1119. The phase interpolation unit 1120 comprises three inverters 1122, 1124, 1116, and two resistors 1128, 1129, wherein the output ends of the inverters 1122 and 1124 are respectively coupled to ends of the resistors 1128 and 1129, the input end of the inverter 1126 is coupled to the other ends of the resistors 1128 and 1129. The phase interpolation unit 1110 comprises three inverters 1132, 1134, 1136, and two resistors 1138, 1139, wherein the output ends of the inverters 1132 and 1134 are respectively coupled to ends of the resistors 1138 and 1139, the input end of the inverter 1136 is coupled to the other ends of the resistors 1138 and 1139.

The inverters 1112, 1114 receive the input signal $S_{11}$ and output the inverted input signals, and the inverted signals pass through the resistors 1118 and 1119 to form a combined signal $I_{11}$ at the input end of the inverter 1116. The inverter 1116 received the combined signal $I_{11}$ which is the superposition result formed from the inverted input signals, such that the interpolated signal $S_{21}$ is the delay version of the input signal $S_{11}$. The inverters 1132, 1134 receive the input signal $S_{12}$ and output the inverted input signals, and the inverted signals pass through the resistor 1138 and 1139 to form a combined signal $I_{22}$ at the input end of the inverter 1136. The inverter 1136 received the combined signal $I_{22}$ which is the superposition result formed from the inverted input signals, such that the interpolated signal $S_{23}$ is the delay version of the input signal $S_{12}$.

The inverters 1122 and 1124 respectively receive input signals $S_{11}$ and $S_{12}$, and output the inverted input signals, and the inverted signals pass through the resistor 1128 and 1129 to form a combined signal $I_{12}$ at the input end of the inverter 1126. The inverter 1126 received the combined signal $I_{12}$ which is the superposition result formed from the inverted input signals, such that the interpolated signal $S_{22}$ is asserted between when the interpolated signals $S_{21}$ and $S_{23}$ are asserted. The inverters 1112-1116, 1122-1126, 1132-1136 may be identical to each other, such that the time difference of the input signals $S_{11}$ and $S_{12}$ is equal to that of the interpolated signals $S_{21}$ and $S_{23}$, and the time when the interpolated signal $S_{22}$ is asserted is the middle value of the times when the interpolated signals $S_{21}$ and $S_{23}$ are asserted.

Figure 3:
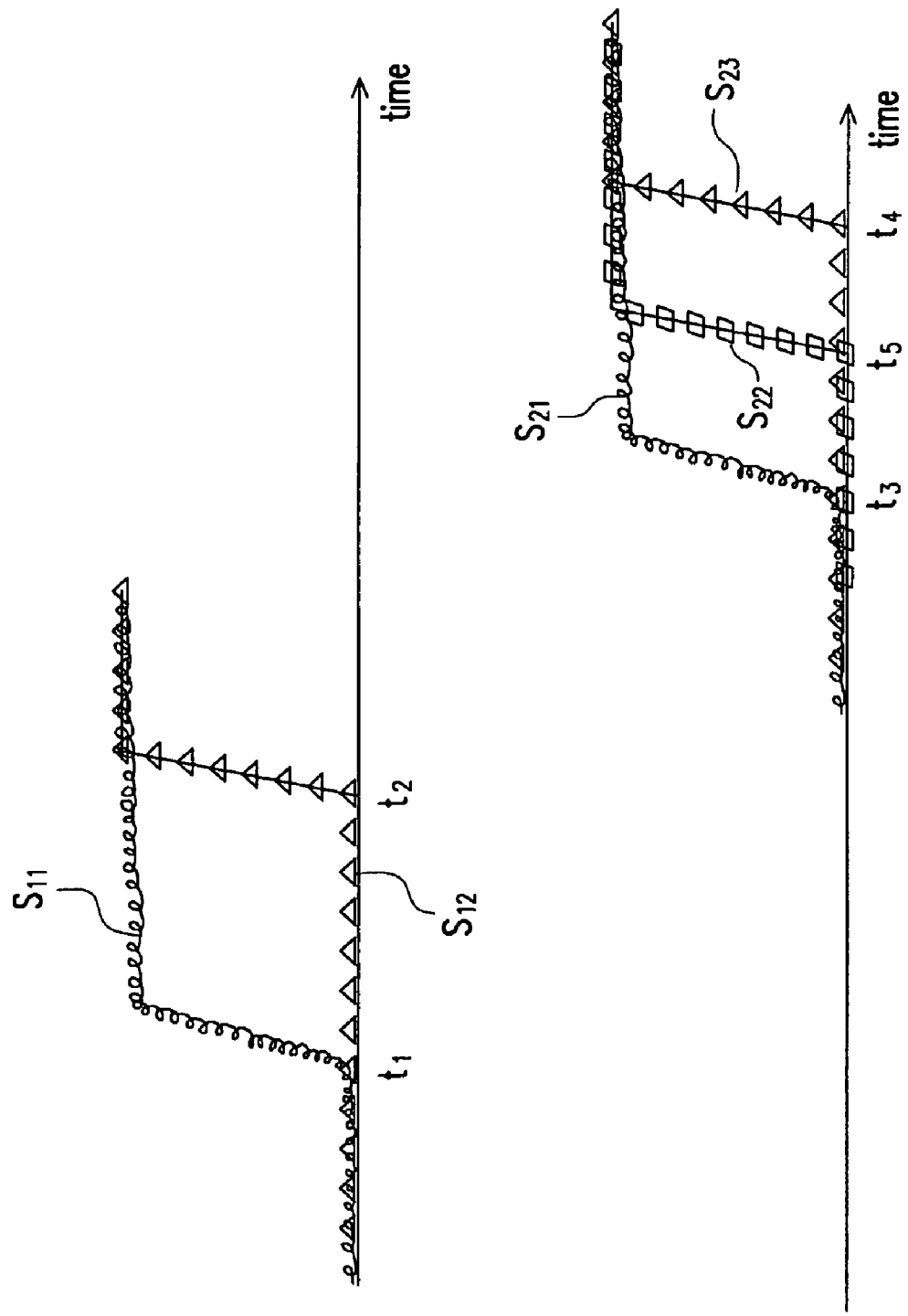
FIG. 3 shows the wave diagrams of the input signals $S_{11}$-$S_{12}$ and the interpolated signals $S_{21}$-$S_{23}$ of a phase interpolation module according to an embodiment of the invention.

Referring to FIG. 3, FIG. 3 shows the wave diagrams of the input signals $S_{11}$-$S_{12}$ and the interpolated signals $S_{21}$-$S_{23}$ of a phase interpolation module according to an embodiment of the invention. The input signals $S_{11}$ and $S_{12}$ are respectively asserted at time $t_1$ and $t_2$, and as described above, the interpolated signals $S_{21}$ and $S_{23}$ are the delay versions of the input signals $S_{11}$ and $S_{12}$. The time difference ($t_2$-$t_1$) between the input signals $S_{11}$ and $S_{12}$ is identical to the time difference ($t_4$-$t_3$) between the interpolated signals $S_{21}$ and $S_{23}$. The time $t_5$ when the interpolated signal $S_{22}$ is asserted is between the time $t_3$ and $t_4$, and in the embodiment, the time $t_5$ may be the middle value of the times $t_3$ and $t_4$.

With such configuration, the fighting current between the inverters 1122 and 1124 is limited by the sum of the resistance of the resistors 1128 and 1129. The sizes of the inverters 1122 and 1124 can be identical by tuning the ratio of the resistance between the resistors 1128 and 1129. The identity of the sizes of the inverters 1122 and 1124 is relatively insensitive to process variation. Furthermore, the interpolated signal $S_{22}$ is not prone to be affected by process variation because the ratio of the resistance between the resistors 1128 and 1129 is relatively insensitive to process variation. According to the similar manner, the sizes of the inverters 1112 and 1114 can be identical by tuning the ratio of the resistance between the resistors 1118 and 1119, and the sizes of the inverters 1132 and 1134 can be identical by tuning the ratio of the resistance between the resistors 1138 and 1139. Therefore, the interpolated signals $S_{21}$ and $S_{23}$ are not prone to be affected by process variation.

Still referring to FIG. 2, the rising time of the combined signals $I_{11}$, $I_{12}$, and $I_{22}$ may be equal owing to the same biasing condition. Furthermore, owing to the same biasing condition, the falling time of the interpolated signals $S_{21}$-$S_{23}$ may be equal similarly. Thus, the interpolated signals $S_{21}$-$S_{23}$ may behave the same duty cycle. The equality of the rising time of the combined signals $I_{11}$, $I_{12}$, and $I_{22}$ can be easy to be achieved by tuning the ratio between the resistors 1128 and 1129 or tuning the sizes of the inverters 1122 and the 1124, such that the sizes of the inverters 1122 and 1124 are identical to each other, or the resistance of the resistor 1128 and the resistance of the resistor 1129 are identical to each other. Therefore, the duty cycles of the interpolated signals $S_{21}$-$S_{23}$ can track those of the input signals $S_{11}$-$S_{12}$ automatically.

Figure 4:
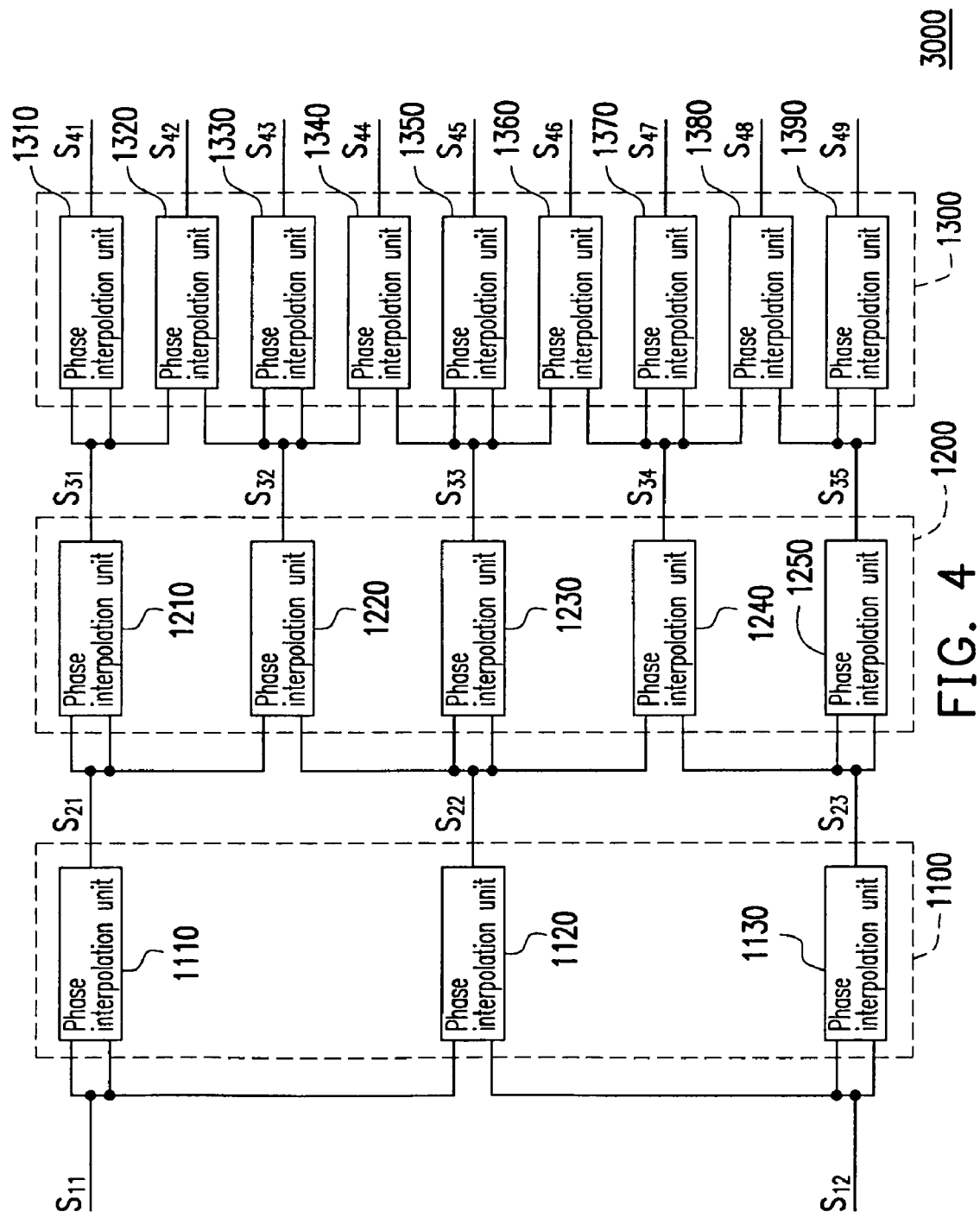
FIG. 4 shows a block diagram of a delay line circuit 3000 according to an embodiment of the invention.

After describing the phase interpolation module consisted of at least one phase interpolation unit, a delay line circuit implemented by the phase interpolation is described as follows. Referring to FIG. 4, FIG. 4 shows a block diagram of a delay line circuit 3000 according to an embodiment of the invention. The delay line circuit 3000 comprises three stages of phase interpolation modules 1100, 1200, and 1300 in the cascade architecture. The delay line circuit 3000 is designed to output nine interpolated signals $S_{41}$-$S_{49}$, but it is noted that, the present invention is not limited thereto. The phase interpolation module 1110 in FIG. 4 is the same as that in FIG. 2. The phase interpolation module 1200 has 5 phase interpolation units 1210-1250, the phase interpolation module 1300 has 9 phase interpolation units 1310-1390, and the detail circuit of each of the interpolation units 1210-1250 and 1310-1390 is the same as the detail circuit of one of the interpolation units 1110-1130.

Figure 5:
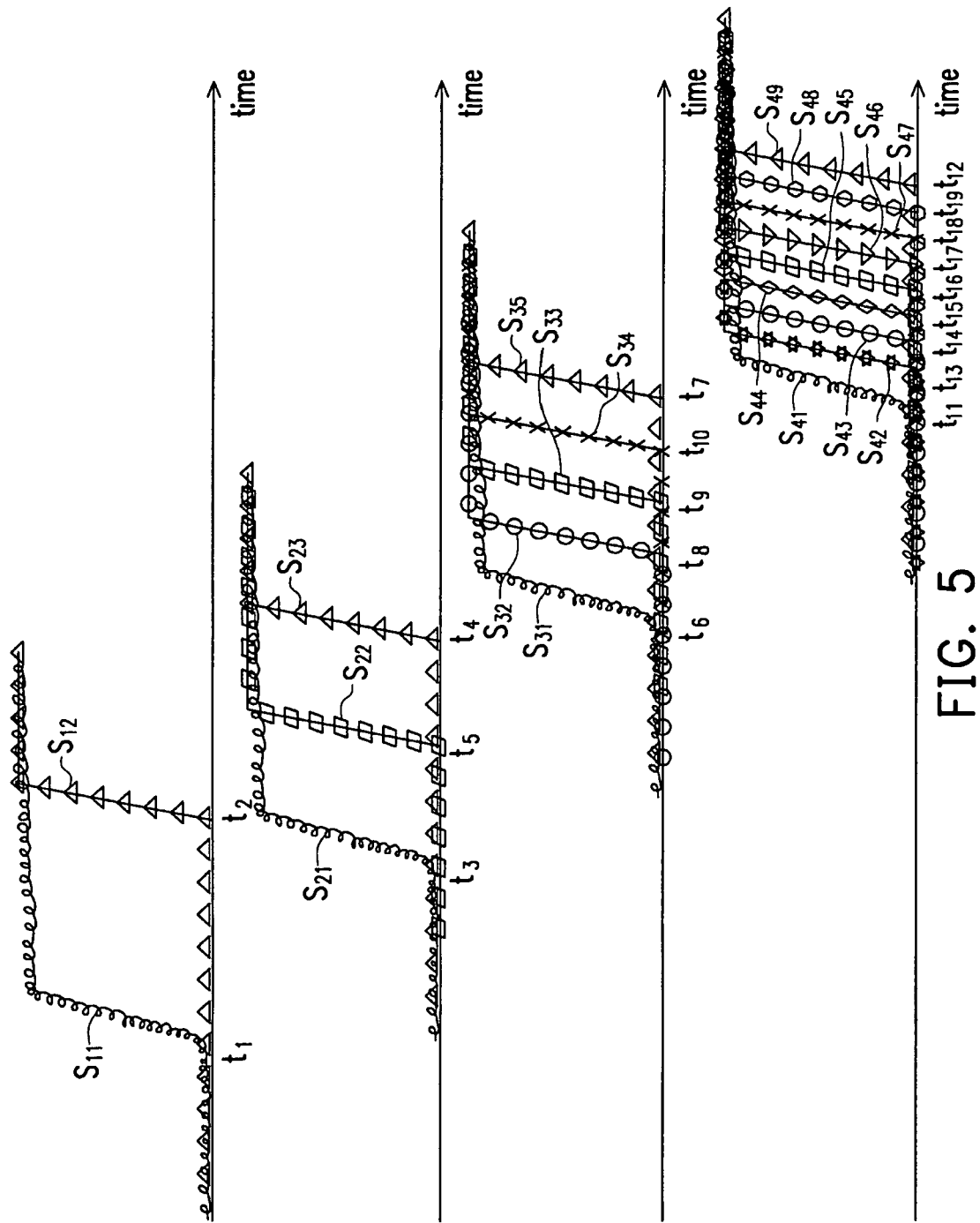
FIG. 5 shows the wave diagram of the input signals $S_{11}$-$S_{12}$ and the interpolated signals $S_{21}$-$S_{23}$, $S_{31}$-$S_{35}$, and $S_{41}$-$S_{49}$ of the phase interpolation module 1200 according to an embodiment of the invention.

Referring to both of FIG. 4 and FIG. 5, FIG. 5 shows the wave diagram of the input signals $S_{11}$-$S_{12}$ and the interpolated signals $S_{21}$-$S_{23}$, $S_{31}$-$S_{35}$, and an $S_{41}$-$S_{49}$ of the delay line circuit 3000 according to an embodiment of the invention. As stated above, the phase interpolation module 1100 receives the input signals $S_{11}$ and $S_{12}$ and outputs the interpolated signals $S_{21}$-$S_{23}$. The description about the input signals $S_{11}$-$S_{12}$, the interpolated signals $S_{21}$-$S_{23}$, and the operation of the phase interpolation module 1110 is not illustrated again. The next description will illustrate the operations of the phase interpolation modules 1120 and 1130, and the interpolated signals $S_{31}$-$S_{35}$ and $S_{41}$-$S_{49}$.

The phase interpolation units 1210, 1230, and 1250 respectively receive the interpolated signals $S_{21}$-$S_{23}$, and respectively output the interpolated signals $S_{31}$, $S_{33}$, and $S_{35}$, wherein the interpolated signals $S_{31}$, $S_{33}$, and $S_{35}$ are delay versions of the interpolated signals $S_{21}$-$S_{23}$. The time difference ($t_5$–$t_3$) of the interpolated signals $S_{21}$ and $S_{22}$ is equal to the time difference ($t_9$–$t_6$) of the interpolated signals $S_{31}$ and $S_{33}$. The time difference ($t_4$–$t_5$) of the interpolated signals $S_{22}$ and $S_{23}$ is equal to the time difference ($t_7$–$t_9$) of the interpolated signals $S_{33}$ and $S_{35}$. The time $t_5$ when the interpolated signal $S_{32}$ is asserted is between the time $t_6$ and $t_9$, and in the embodiment, the time $t_8$ may be the middle value of the times $t_6$ and $t_9$. The time $t_{10}$ when the interpolated signal $S_{34}$ is asserted is between the time $t_9$ and $t_7$, and in the embodiment, the time $t_{10}$ may be the middle value of the times $t_9$ and $t_7$.

The phase interpolation units 1310, 1330, 1350, 1370, and 1390 respectively receive the interpolated signals $S_{31}$-$S_{35}$, and respectively output the interpolated signals $S_{41}$, $S_{43}$, $S_{45}$, $S_{47}$ and $S_{49}$, wherein the interpolated signals $S_{41}$, $S_{43}$, $S_{45}$, $S_{47}$ and $S_{49}$ are delay versions of the interpolated signals $S_{31}$-$S_{35}$. The time difference ($t_{846}$) of the interpolated signals $S_{31}$ and $S_{32}$ is equal to the time difference ($t_{14}$–$t_{11}$) of the interpolated signals $S_{41}$ and $S_{43}$. The time difference ($t_9$–$t_8$) of the interpolated signals $S_{32}$ and $S_{33}$ is the same as the time difference ($t_{16}$–$t_{14}$) of the interpolated signals $S_{43}$ and $S_{45}$. The time difference ($t_{10}$–$t_9$) of the interpolated signals $S_{33}$ and $S_{34}$ is equal to the time difference ($t_{18}$–$t_{16}$) of the interpolated signals $S_{45}$ and $S_{47}$. The time difference ($t_7$–$t_{10}$) of the interpolated signals $S_{34}$ and $S_{35}$ is equal to the time difference ($t_{12}$–$t_{18}$) of the interpolated signals $S_{47}$ and $S_{49}$. The time $t_{13}$ when the interpolated signal $S_{42}$ is asserted is between the time $t_{11}$ and $t_{14}$, and in the embodiment, the time $t_{13}$ may be the middle value of the times $t_{11}$ and $t_{14}$. The time $t_{15}$ when the interpolated signal $S_{44}$ is asserted is between the time $t_{14}$ and $t_{16}$, and in the embodiment, the time $t_{15}$ may be the middle value of the times $t_{14}$ and $t_{16}$. The time $t_{17}$ when the interpolated signal $S_{45}$ is asserted is between the time $t_{16}$ and $t_{18}$, and in the embodiment, the time $t_{17}$ may be the middle value of the times $t_{16}$ and $t_{18}$. The time $t_{19}$ when the interpolated signal $S_{48}$ is asserted is between the time $t_{18}$ and $t_{12}$, and in the embodiment, the time $t_{19}$ may be the middle value of the times $t_{18}$ and $t_{12}$.

It is noted that the number the phase interpolation modules in the embodiment is not used to limit the present invention, and the number of the phase interpolation units in the phase interpolation module is not also used to limit the present invention. For example, the phase interpolation module 1300 may be removed from the delay line circuit 3000. For example, the phase interpolation unit 1230 may be removed from the phase interpolation module 1200. In other words, the designer can use at least one the phase interpolation unit to form at least one the phase interpolation module, such that the designed delay line circuit can meet the requirements specified in the different applications.

Figure 6:
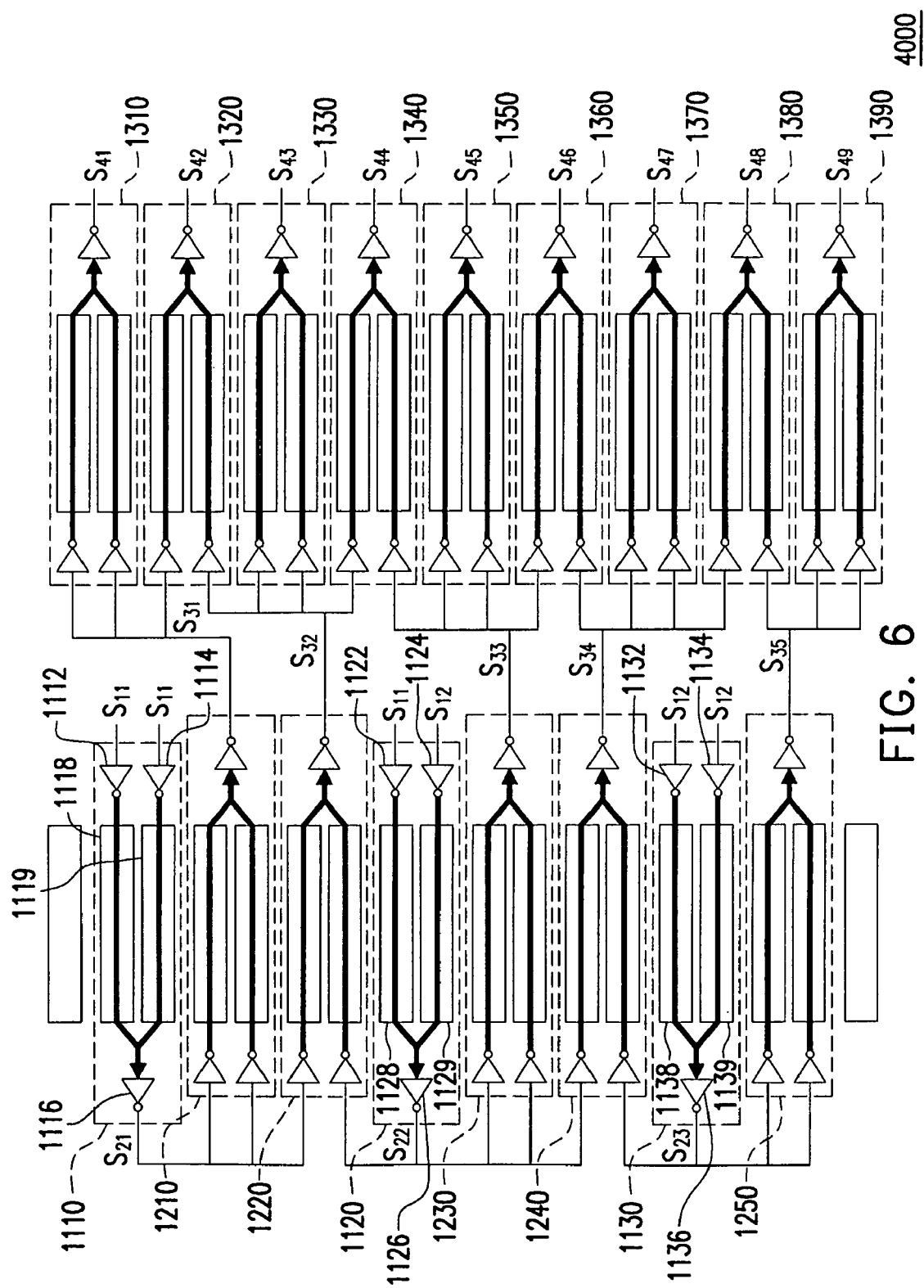
FIG. 6 shows a layout diagram of the circuit layout 4000 of the delay line circuit 3000 according to an embodiment of the invention.

FIG. 6 shows a layout diagram of the circuit layout 4000 of the delay line circuit 3000 according to an embodiment of the invention. Referring to FIG. 4 and FIG. 6, the circuit layout 4000 includes three phase interpolation modules 1100~1300. The phase interpolation module 1100 comprising three identical phase interpolation units 1110~1130, the interpolation module 1200 comprising five identical phase interpolation units 1210~1250, and the interpolation module 1300 comprising nine identical phase interpolation units 1310~1390. In FIG. 6, each of the solid rectangular blocks presents a resistor, such as resistor 1118, 1119, or the other one. The lengths of the rectangular blocks can be identical to each other, and the widths of the rectangular blocks can be identical to each other too. That is, sizes of the layouts of the resistors are identical to each other. Furthermore, the resistance value of the resistor can be determined by positions of two metal contacts. For example, the longer the length between the two metal contacts is, the larger the resistance value of the resistor is. There are two columns of the resistors in FIG. 6, and each column has 18 resistors. The top and bottom resistors of the first column (i.e. the first and $18^{th}$ resistors of the left column) are not used and may be removed in the other embodiment. However, since the circuit layout may be manufactured in a symmetrical shape, thus the first column (i.e. the left column) has the two unused resistors in the top and bottom in the embodiment.

The second and third resistors of the first column are used as the resistors and 1118 and 1119 of the phase interpolation unit 1110. The inverters 1112 and 1114 are connected to the right terminals of the second and third resistors 1118 and 1119, and the inverter 1116 is connected to the left terminals of the second and third resistors 1118 and 1119. The fourth and fifth resistors of the first column are used as the resistors of the phase interpolation unit 1210. The two inverters of the phase interpolation unit 1210 are connected to the left terminals of the fourth and fifth resistors of the first column, and the other one inverter of the phase interpolation unit 1210 is connected to the right terminals of the fourth and fifth resistors of the first column.

The sixth and seventh resistors of the first column are used as the resistors of the phase interpolation unit 1220. The two inverters of the phase interpolation unit 1220 are connected to the left terminals of the sixth and seventh resistors of the first column, and the other one inverter of the phase interpolation unit 1210 is connected to the right terminals of the sixth and seventh resistors of the first column. The $8^{th}$ and $9^{th}$ resistors of the first column are used as the resistors 1128 and 1129 of the phase interpolation unit 1120. The two inverters 1122 and 1124 of the phase interpolation unit 1120 are connected to the right terminals of the $8^{th}$ and $9^{th}$ resistors of the first column, and the other one inverter 1126 of the phase interpolation unit 1120 is connected to the left terminals of the $8^{th}$ and $9^{th}$ resistors of the first column.

The $10^{th}$ and $11^{th}$ resistors of the first column are used as the resistors of the phase interpolation unit 1230. The two inverters of the phase interpolation unit 1230 are connected to the left terminals of the $10^{th}$ and $11^{th}$ resistors of the first column, and the other one inverter of the phase interpolation unit 1230 is connected to the right terminals of the $10^{th}$ and $11^{th}$ resistors of the first column. The $12^{th}$ and $13^{th}$ resistors of the first column are used as the resistors of the phase interpolation unit 1240. The two inverters of the phase interpolation unit 1240 are connected to the left terminals of the $12^{th}$ and $13^{th}$ resistors of the first column, and the other one inverter of the phase interpolation unit 1240 is connected to the right terminals of the $12^{th}$ and $13^{th}$ resistors of the first column.

The $14^{th}$ and $15^{th}$ resistors of the first column are used as the resistors 1138 and 1139 of the phase interpolation unit 1130. The two inverters 1132 and 1134 of the phase interpolation unit 1130 are connected to the right terminals of the $14^{th}$ and $15^{th}$ resistors of the first column, and the other one inverter 1136 of the phase interpolation unit 1130 is connected to the left terminals of the $14^{th}$ and $15^{th}$ resistors of the first column. The $16^{th}$ and $17^{th}$ resistors of the first column are used as the resistors of the phase interpolation unit 1250. The two inverters of the phase interpolation unit 1250 are connected to the left terminals of the $16^{th}$ and $17^{th}$ resistors of the first column, and the other one inverter of the phase interpolation unit 1250 is connected to the right terminals of the $16^{th}$ and $17^{th}$ resistors of the first column.

The resistors of the second column are used as the resistors of the phase interpolation units 1310-1390 of the phase interpolation module 1300. The circuit layouts of the phase interpolation units 1310-1390 are identical to each other. Each two consecutive resistors of the second column are used as the resistors of the phase interpolation unit. Taking the phase interpolation unit 1310 as the example, the first and second resistors of the second column are used as the resistors of the phase interpolation unit 1310. The two inverters of the phase interpolation unit 1310 are connected to the left terminals of the first and second resistors of the second column, and the other one inverter of the phase interpolation unit 1310 is connected to the right terminals of the first and second resistors of the second column. In the similar manner, the circuit layout of the phase interpolation units 1320-1390 can be deduced without describing again.

With the configuration described above, the circuit layout 4000 compact the two phase interpolation modules 1100~1200 in the left side, and compact the phase interpolation module 1300 in the right side. The compaction of the circuit layout 4000 is beneficial to lower interconnect routing of the circuit and to reduce the critical timing issue of the signals. Moreover, the phase interpolation units 1210~1220 of the phase interpolation module 1200 are placed between the phase interpolation units 1110 and 1120 of the phase interpolation module 1100, meanwhile the phase interpolation units 1230~1240 of the phase interpolation module 1200 are placed between the phase interpolation units 1120 and 1130 of the phase interpolation module 1100. The regularity of the placement for the units is also helpful to reduce the critical timing issue of the signals. In the embodiment, the circuit layout is applied to the delay line circuit, but not limited to, can be applied to any circuit having the delay line circuit, such as operational amplifiers or high-speed circuits.

Accordingly, the embodiment of the present invention provides a phase interpolation module for reducing the fighting current. Furthermore, the phase interpolation module has the inverters having the identical sizes, and therefore the phase interpolation module is relatively insensitive to the process variation. The phase interpolation modules may form a delay line circuit having the advantages of the phase interpolation module as stated above. Moreover, a circuit layout of the delay line circuit is provided to reduce the critical timing issue of the signals.

Reference will now be made in detail to the present preferred embodiments of the invention, examples of which are illustrated in the accompanying drawings. Wherever possible, the same reference numbers are used in the drawings and the description to refer to the same or like parts.

What is claimed is:

1. A phase interpolation module, comprising:
    a first, second, and third phase interpolation units, each of the first, second, and third phase interpolation units including:
        a first inverter;
        a second inverter;
        a third inverter;
        a first resistor, coupled between an output end of the first inverter and an input end of the third inverter; and
        a second resistor, coupled between an output end of the second inverter and the input end of the third inverter;
    wherein the first and second inverters of the first phase interpolation unit receive a first signal, the first and second inverters of the third phase interpolation unit receive a second signal, and the first and second inverters of the second phase interpolation unit respectively receive the first and second signals,
    wherein the first and second inverters have identical sizes.

2. The phase interpolation module according to claim 1, wherein the first and second resistors have identical resistances.

3. A delay line circuit, comprising:
    a first phase interpolation module, comprising a first, second, and third phase interpolation units, each of the first, second, and third phase interpolation units including:
        a first inverter;
        a second inverter;
        a third inverter;
        a first resistor, coupled between an output end of the first inverter and an input end of the third inverter; and
        a second resistor, coupled between an output end of the second inverter and the input end of the third inverter;
    wherein the first and second inverters of the first phase interpolation unit receive a first signal, the first and second inverters of the third phase interpolation unit receive a second signal, and the first and second inverters of the second phase interpolation unit respectively receive the first and second signals; the third inverter of the first phase interpolation unit outputs a third signal, the third inverter of the third phase interpolation unit outputs a fifth signal, and the third inverter of the second phase interpolation unit outputs a fourth signal,
    wherein the first and second inverter have identical sizes.

4. The delay line circuit according to claim 3, wherein a time difference of the first and second signals is equal to the time difference of the third and fifth signals.

5. The delay line circuit according to claim 3, wherein a time when the fourth signal is asserted is between times when the third and the fifth signals are asserted.

6. The delay line circuit according to claim 5, wherein the time when the fourth signal is asserted is the middle value of the times when the third and the fifth signals are asserted.

7. The delay line circuit according to claim 3, wherein the first and second resistors have identical resistances.

8. The delay line circuit according to claim 3, further comprising a second phase interpolation module, wherein the second phase interpolation module comprises a fourth through eighth phase interpolation units.

9. The delay line circuit according to claim 8, wherein each of the fourth through eighth phase interpolation units comprises:
    a first inverter;
    a second inverter;
    a third inverter;
    a first resistor, coupled between an output end of the first inverter and an input end of the third inverter; and
    a second resistor, coupled between an output end of the second inverter and the input end of the third inverter;
    wherein the first and second inverters of the fourth phase interpolation unit receive a third signal, and the third inverter of the fourth phase interpolation unit outputs a sixth signal; the first and second inverters of the fifth phase interpolation unit respectively receive a third and fourth signals, and the third inverter of the fifth phase interpolation unit outputs a seventh signal; the first and second inverters of the sixth phase interpolation unit receive a fourth signal, and the third inverter of the sixth phase interpolation unit outputs a eighth signal; the first and second inverters of the seventh phase interpolation unit respectively receive a fourth and fifth signals, and the third inverter of the seventh phase interpolation unit outputs a $9^{th}$ signal; the first and second inverters of the eighth phase interpolation unit receive a fifth signal, and the third inverter of the eighth phase interpolation unit outputs a $10^{th}$ signal.

10. The delay line circuit according to claim 9, wherein a time difference of the first and second signals is equal to the time difference of the sixth and $10^{th}$ signals.

11. The delay line circuit according to claim 9, wherein a time when the seventh signal is asserted is between times when the sixth and the eighth signals are asserted, and a time when the ninth signal is asserted is between times when the eighth and the $10^{th}$ signals are asserted.

12. The delay line circuit according to claim 11, wherein the time when the eighth signal is asserted is the middle value of the times when the sixth and the $10^{th}$ signals are asserted, the time when the seventh signal is asserted is the middle value of the times when the sixth and the eighth signals are asserted, and the time when the ninth signal is asserted is the middle value of the times when the eighth and the $10^{th}$ signals are asserted.

13. The delay line circuit according to claim 9, wherein the first and second resistors are resistors placed in a column.

14. The delay line circuit according to claim 13, wherein circuit layouts of the first through third phase interpolation units are opposed to circuit layouts of the fourth through eighth phase interpolation units.

15. The delay line circuit according to claim 14, wherein the resistors placed on the column comprises a second through $17^{th}$ resistors arranged sequentially, the second and third resistors are the first and second resistors of the first phase interpolation unit, the fourth and fifth resistors are the first and second resistors of the fourth phase interpolation unit, the sixth and seventh resistors are the first and second resistors of the fifth phase interpolation unit, the eighth and ninth resistors are the first and second resistors of the second phase interpolation unit, the $10^{th}$ and $11^{th}$ resistors are the first and second resistors of the sixth phase interpolation unit, the $12^{th}$ and $13^{th}$ resistors are the first and second resistors of the seventh phase interpolation unit, the $14^{th}$ and $15^{th}$ resistors are the first and second resistors of the third phase interpolation unit, and the $16^{th}$ and $17^{th}$ resistors are the first and second resistors of the eighth phase interpolation unit.

\* \* \* \* \*